(12) United States Patent  
Zhu et al.

(10) Patent No.: US 11,837,630 B1  
(45) Date of Patent: Dec. 5, 2023

(54) SEMICONDUCTOR DEVICE FOR REDUCING SWITCHING LOSS AND MANUFACTURING METHOD THEREOF

(71) Applicant: WUXI NCE POWER CO., LTD, Wuxi (CN)

(72) Inventors: Yuanzheng Zhu, Wuxi (CN); Xuequan Huang, Wuxi (CN); Zhuo Yang, Wuxi (CN)

(73) Assignee: WUXI NCE POWER CO., LTD, Wuxi (CN)

( * ) Notice: Subject to any disclaimer, the term of this patent is extended or adjusted under 35 U.S.C. 154(b) by 0 days.

(21) Appl. No.: 18/023,752

(22) PCT Filed: Oct. 25, 2021

(86) PCT No.: PCT/CN2021/125973  
§ 371 (c)(1),  
(2) Date: Feb. 28, 2023

(87) PCT Pub. No.: WO2022/193656  
PCT Pub. Date: Sep. 22, 2022

(30) Foreign Application Priority Data

Mar. 15, 2021 (CN) .......................... 202110274169.6

(51) Int. Cl.  
*H01L 29/06* (2006.01)  
*H01L 29/10* (2006.01)  
(Continued)

(52) U.S. Cl.  
CPC .... *H01L 29/0634* (2013.01); *H01L 21/02532* (2013.01); *H01L 21/02579* (2013.01);  
(Continued)

(58) Field of Classification Search  
CPC ..................... H01L 29/0634; H01L 21/02532  
(Continued)

(56) References Cited

U.S. PATENT DOCUMENTS

| 2012/0007173 A1* | 1/2012 | Yamamoto | .......... | H01L 29/1095 438/270 |
| 2014/0070852 A1* | 3/2014 | Saito | ...................... | H03K 3/012 327/109 |

(Continued)

FOREIGN PATENT DOCUMENTS

| CN | 107068763 A | 8/2017 |
| CN | 108831927 A | 11/2018 |

(Continued)

*Primary Examiner* — Igwe U Anya  
(74) *Attorney, Agent, or Firm* — Bayramoglu Law Offices LLC

(57) ABSTRACT

A semiconductor device for reducing a switching loss includes a drain metal. A silicon substrate of a first conductive type is provided on the drain metal. An epitaxial layer of the first conductive type is provided on the silicon substrate of the first conductive type. A pillar of the first conductive type and a pillar of a second conductive type are arranged in the epitaxial layer of the first conductive type. A body region of the second conductive type is provided on a surface of each pillar. A heavily doped source region of the first conductive type and a heavily doped source region of the second conductive type are arranged in the body region of the second conductive type. A gate trench is formed in the pillar of the first conductive type. Discrete gate polycrystalline silicon is provided in the gate trench.

8 Claims, 17 Drawing Sheets

(51) Int. Cl.
*H01L 29/40* (2006.01)
*H01L 29/78* (2006.01)
*H01L 29/66* (2006.01)
*H01L 21/02* (2006.01)
*H01L 21/265* (2006.01)
*H01L 21/266* (2006.01)
*H01L 21/3065* (2006.01)

(52) U.S. Cl.
CPC ...... *H01L 21/266* (2013.01); *H01L 21/26513* (2013.01); *H01L 21/3065* (2013.01); *H01L 29/1095* (2013.01); *H01L 29/407* (2013.01); *H01L 29/66734* (2013.01); *H01L 29/7813* (2013.01)

(58) Field of Classification Search
USPC .......................................................... 257/330
See application file for complete search history.

(56) References Cited

U.S. PATENT DOCUMENTS

2015/0200248 A1* 7/2015 Ono .................... H01L 29/7813
257/330
2015/0295078 A1  10/2015 Siemieniec et al.

FOREIGN PATENT DOCUMENTS

| CN | 111180521 A | 5/2020 |
| CN | 111415867 A | 7/2020 |
| CN | 113066865 A | 7/2021 |

\* cited by examiner

SEMICONDUCTOR DEVICE FOR REDUCING SWITCHING LOSS AND MANUFACTURING METHOD THEREOF

CROSS REFERENCE TO THE RELATED APPLICATIONS

This application is the national phase entry of International Application No. PCT/CN2021/125973, filed on Oct. 25, 2021, which is based upon and claims priority to Chinese Patent Application No. 202110274169.6, filed on Mar. 15, 2021, the entire contents of which are incorporated herein by reference.

TECHNICAL FIELD

The present disclosure relates to a semiconductor device and a manufacturing method thereof, and in particular to a power semiconductor device for decreasing a gate charge, improving a switching speed and reducing a switching loss and a manufacturing method thereof.

BACKGROUND

As new-generation power semiconductor devices, metal-oxide semiconductor field-effect transistors (MOSFETs) have been widely applied to systems in new energy, automobile electronics, power electronics and others. The power loss in operation of an MOSFET device mainly consists of a conduction loss and a switching loss. Particularly in case of a high frequency, the total loss of the MOSFET device mainly depends on the switching loss.

The input capacitance Ciss of the MOSFET device is of great importance to the switching loss, where Ciss=Cgs+Cgd. The Cgs is mainly determined by an area of an overlapping region between polycrystalline silicon and a body region of a second conductive type, while the Cgd is mainly determined by an area of an overlapping region between the polycrystalline silicon and a pillar of a first conductive type. Therefore, as the overlapping areas between the polycrystalline silicon and the body region of the second conductive type and the pillar of the first conductive type increase, Ciss increases, turn-on time and turn-off time of the device increase, and a switching loss of the device also increases, thereby reducing the efficiency of the system.

SUMMARY

An objective of the present disclosure is to provide a semiconductor device for reducing a switching loss and a manufacturing method thereof to overcome problems of a large gate charge and a large switching loss of the device in the prior art. The manufacturing method of the device is compatible with the existing semiconductor process. To achieve the above objective, the present disclosure adopts the following technical solutions.

According to a first aspect, an embodiment of the present disclosure provides a semiconductor device for reducing a switching loss, including a drain metal. A silicon substrate of a first conductive type is provided on the drain metal. A contact surface between the drain metal and the silicon substrate of the first conductive type defines a lower surface. An epitaxial layer of the first conductive type is provided on the silicon substrate of the first conductive type. A pillar of the first conductive type and a pillar of a second conductive type that are spaced apart from each other are arranged in the epitaxial layer of the first conductive type. A body region of the second conductive type is provided on a surface of each of the pillar of the first conductive type and the pillar of the second conductive type. A heavily doped source region of the first conductive type and a heavily doped source region of the second conductive type are arranged in the body region of the second conductive type. The source region of the first conductive type is electrically connected to a substrate metal. The source region of the second conductive type is electrically connected to a source metal. A gate trench is formed in the pillar of the first conductive type. An insulating dielectric layer covers onto the gate trench.

Discrete gate polycrystalline silicon is provided in the gate trench. First gate polycrystalline silicon is located on a surface of the trench, and second gate polycrystalline silicon is located at a bottom of the trench. The first gate polycrystalline silicon and the second gate polycrystalline silicon are isolated by an oxide layer. The first gate polycrystalline silicon is insulated from the second gate polycrystalline silicon.

Further, a high-concentration buried layer of the second conductive type may be provided in the pillar of the second conductive type.

Further, for an N-type power semiconductor device, the first conductive type may be an N type, and the second conductive type may be a P type. For a P-type power semiconductor device, the first conductive type may be a P type, and the second conductive type may be an N type.

Further, the gate trench may have an opening width of 0.3-2 μm.

Further, the gate trench may have a depth of 0.5-5 μm.

Further, the second gate polycrystalline silicon may have a length of 0.3-4 μm.

According to a second aspect, an embodiment of the present disclosure provides a manufacturing method of a semiconductor device for reducing a switching loss, including the following steps:

step 1: selecting a material of a silicon substrate of a first conductive type, and epitaxially growing an epitaxial layer of the first conductive type;

step 2: performing selective etching on the epitaxial layer of the first conductive type to form a deep trench;

step 3: depositing silicon of a second conductive type to fill the deep trench fully, forming a pillar of the first conductive type and a pillar of the second conductive type that are spaced apart from each other in the epitaxial layer of the first conductive type, and removing a structure above an upper surface;

step 4: performing selective etching on the epitaxial layer of the first conductive type to form a gate trench, growing an oxide layer in the gate trench, depositing polycrystalline silicon and etching the polycrystalline silicon to a certain depth to form second gate polycrystalline silicon, growing an oxide layer between first gate polycrystalline silicon and the second gate polycrystalline silicon, depositing the polycrystalline silicon again to form the first gate polycrystalline silicon, and removing a structure above the upper surface;

step 5: injecting high-concentration impurities of the second conductive type into the pillar of the second conductive type by high-energy ion implantation using a mask window, and activating the impurities to form a buried layer of the second conductive type;

step 6: injecting impurities of the second conductive type into the upper surface, and performing thermal annealing to form a body region of the second conductive type;

step 7: injecting the impurities of the second conductive type into the body region of the second conductive type using the mask window, and activating the impurities to form a source region of the second conductive type;

step 8: injecting impurities of the first conductive type into two sides of the gate trench using the mask window, and activating the impurities to form a source region of the first conductive type; and step 9: depositing an insulating dielectric layer on a front surface, performing selective etching on the insulating dielectric layer to form through holes, depositing metal and selectively etching the metal to form a source metal, a substrate metal, a drain metal, a first gate metal and a second gate metal.

According to a third aspect, an embodiment of the present disclosure provides a manufacturing method of a semiconductor device for reducing a switching loss, including the following steps:

step 1: selecting a material of a silicon substrate of a first conductive type, and epitaxially growing an epitaxial layer of the first conductive type;

step 2: injecting impurities of a second conductive type having a low diffusion coefficient and impurities of the second conductive type having a high diffusion coefficient into a surface of the epitaxial layer of the first conductive type using a mask window to form a pillar of the second conductive type and a buried layer of the second conductive type;

step 3: performing second epitaxial growth on an upper surface to continuously grow the epitaxial layer of the first conductive type, where the pillar of the second conductive type is diffused more than the buried layer of the second conductive type during growth of the epitaxial layer;

step 4: injecting the impurities of the second conductive type having the high diffusion coefficient into the upper surface using the mask window in step 2, and activating the impurities by thermal annealing, such that the impurities are further diffused to connect the pillar of the second conductive type in step 3, thereby forming the final pillar of the second conductive type;

step 5: performing selective etching on the epitaxial layer of the first conductive type to form a gate trench, growing an oxide layer in the gate trench, depositing polycrystalline silicon and etching the polycrystalline silicon to a certain depth to form second gate polycrystalline silicon, growing an oxide layer between first gate polycrystalline silicon and the second gate polycrystalline silicon, depositing the polycrystalline silicon again to form the first gate polycrystalline silicon, and removing a structure above the upper surface;

step 6: injecting impurities of the second conductive type into the upper surface, and performing the thermal annealing to form a body region of the second conductive type;

step 7: injecting the impurities of the second conductive type into the body region of the second conductive type using the mask window, and activating the impurities to form a source region of the second conductive type;

step 8: injecting impurities of the first conductive type into two sides of the gate trench using the mask window, and activating the impurities to form a source region of the first conductive type; and step 9: depositing an insulating dielectric layer on a front surface, performing selective etching on the insulating dielectric layer to form through holes, depositing metal and selectively etching the metal to form a source metal, a substrate metal, a drain metal, a first gate metal and a second gate metal.

Compared with the prior art, the present disclosure has the following advantages:

1) The conventional super junction trench power MOSFET device shown in FIG. 3 only includes first gate polycrystalline silicon. As the bottom of the first gate polycrystalline silicon overlaps with the pillar of a first conductive type, there is a large Cgd, namely a Miller capacitance. Due to the Miller effect arising from the Miller capacitance, charges will be formed into a platform voltage when a gate voltage of the MOSFET device raises, thereby affecting the turn-on time and the turn-on loss of the device. As shown in FIG. 1, the semiconductor device for reducing a switching loss provided by the present disclosure is further provided under the first gate polycrystalline silicon with second gate polycrystalline silicon insulated from the first gate polycrystalline silicon. As a result, the overlapping region between the first gate polycrystalline silicon and the pillar of the first conductive type is small, and the Cgd is small. When the device is turned on or off, the time for which the gate platform voltage is maintained is short, or even the gate platform voltage can be eliminated. A turn-on waveform of the structure of the present disclosure is as illustrated in FIG. 11. Therefore, the structure of the present disclosure is turned on more quickly than the conventional structure. The turn-on loss is considered as an integral of the drain voltage and the drain current over time when the device is turned on. The greater the turn-on speed, the lower the turn-on loss of the device.

2) When withstanding the voltage, the conventional super junction trench power MOSFET device only bears the high voltage from the drain based on the depletion of the body region of the second conductive type and the pillar of the second conductive type on the pillar of the first conductive type. When the structure of the present disclosure operates, the second gate polycrystalline silicon and the substrate metal are grounded or connected to a negative voltage. The body region of the second conductive type, the pillar of the second conductive type and the second gate polycrystalline silicon deplete charges in the pillar of the first conductive type (namely the drift region) to pinch off the conductive channel, and bear the high voltage from the drain. Therefore, the structure of the present disclosure achieves a higher depletion efficiency than the conventional structure when turned off, thereby improving the turn-off speed and reducing the turn-off loss. The comparison between the structure of the present disclosure and the conventional structure in the turn-off waveform is as illustrated in FIG. 12. As can be seen from the figure, the structure of the present disclosure is turned off more quickly than the conventional structure.

DETAILED DESCRIPTION OF THE EMBODIMENTS

It should be noted that the embodiments in the present disclosure or features in the embodiments may be combined in a non-conflicting manner. The present disclosure will be described in detail below with reference to the accompanying drawings and the embodiments.

To make those skilled in the art better understand the solutions in the present disclosure, the following clearly and completely describes the technical solutions in the embodiments of the present disclosure with reference to the accompanying drawings in the embodiments of the present disclosure. Apparently, the described embodiments are merely some rather than all of the embodiments of the present disclosure. All other embodiments obtained by those of ordinary skill in the art based on the embodiments of the present disclosure without creative efforts shall fall within the protection scope of the present disclosure.

It should be noted that the terms "first", "second", and so on in the specification and claims of the present disclosure and in the accompanying drawings are intended to distinguish similar objects but do not necessarily indicate a specific order or sequence. It should be understood that the data termed in such a way is interchangeable in proper circumstances such that the embodiments of the present disclosure described herein can be implemented in other orders than the order illustrated or described herein. Moreover, the terms "include", "have" and their variants mean to cover a non-exclusive inclusion. For example, a process, method, system, product or device that includes a list of steps or units is not necessarily limited to those steps or units which are clearly listed. Instead, they may include other steps or units which are not expressly listed or inherent to such a process, method, product, or device.

Figure 1:
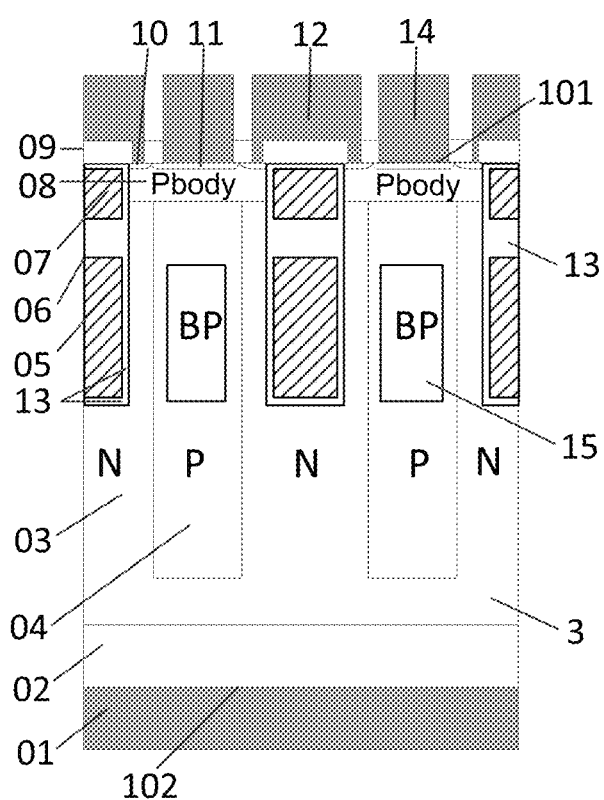
FIG. 1 is a cross-sectional structural view according to a first embodiment of the present disclosure.

A first embodiment of the present disclosure provides a semiconductor device for reducing a switching loss, which takes an N-type super junction trench power semiconductor device as an example. FIG. 1 is a schematic structural view provided by the embodiment of the present disclosure. As shown in FIG. 1, the semiconductor device for reducing a switching loss includes a drain metal 01.

An N-type silicon substrate 02 is provided on the drain metal 01. A contact surface between the drain metal 01 and the N-type silicon substrate 02 defines a lower surface 102. An N-type epitaxial layer 3 is provided on the N-type silicon substrate 02. An N-type pillar 03 and a P-type pillar 04 that are spaced apart from each other are arranged in the N-type epitaxial layer 3. A high-concentration P-type buried layer 15 is provided in the P-type pillar. A P-type body region 08 is provided on a surface of each of the N-type pillar 03 and the P-type pillar 04. A heavily doped N-type source region 10 and a heavily doped P-type source region 11 are arranged in the P-type body region 08. The N-type source region 10 is electrically connected to a substrate metal 12. The P-type source region 11 is electrically connected to a source metal 14. A gate trench 06 is formed in the N-type pillar 03. An insulating dielectric layer 9 covers onto the gate trench.

Discrete gate polycrystalline silicon is provided in the gate trench 06. First gate polycrystalline silicon 07 is located on a surface of the trench, and second gate polycrystalline silicon 05 is located at a bottom of the trench. The first gate polycrystalline silicon 07 and the second gate polycrystalline silicon 05 are isolated by an oxide layer 13. The first gate polycrystalline silicon 07 is insulated from the second gate polycrystalline silicon 05.

Preferably, the gate trench 06 has an opening width of 0.3-2 μm. The gate trench 06 has a depth of 0.5-5 μm. The second gate polycrystalline silicon 05 has a length of 0.3-4 μm.

The semiconductor device is a super junction MOSFET.

Figure 2:
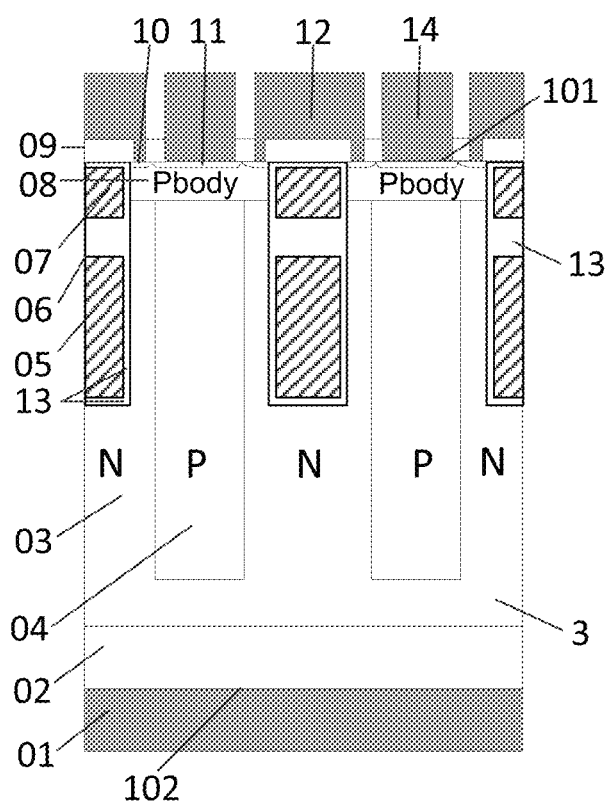
FIG. 2 is a cross-sectional structural view according to a second embodiment of the present disclosure.
Figure 3:
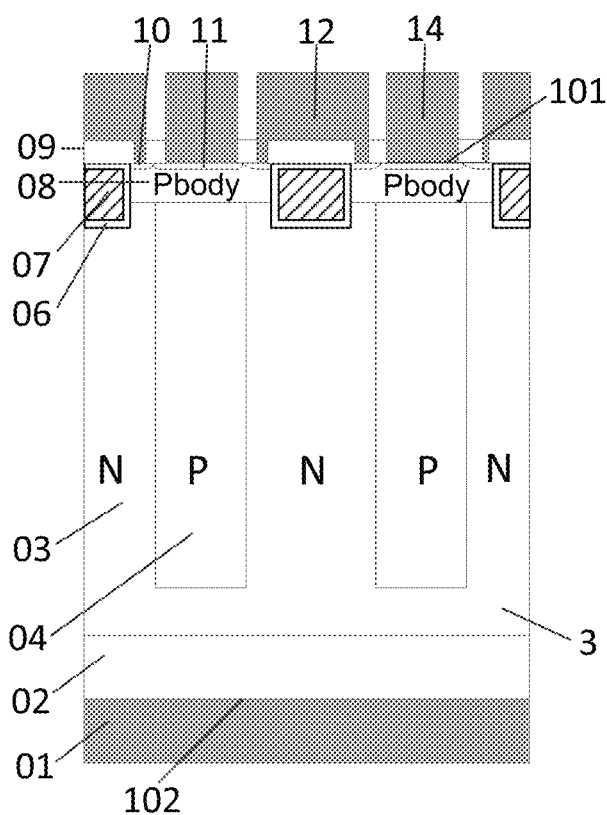
FIG. 3 is a cross-sectional structural view of a conventional super junction trench power MOSFET.

A second embodiment of the present disclosure provides a semiconductor device for reducing a switching loss, which takes an N-type super junction trench power semiconductor device as an example. As shown in FIG. 2, the semiconductor device for reducing a switching loss includes a drain metal 01. An N-type silicon substrate 02 is provided on the drain metal 01. A contact surface between the drain metal 01 and the N-type silicon substrate 02 defines a lower surface 102. An N-type epitaxial layer 3 is provided on the N-type silicon substrate 02. An N-type pillar 03 and a P-type pillar 04 that are spaced apart from each other are arranged in the N-type epitaxial layer 3. A P-type body region 08 is provided on a surface of each of the N-type pillar 03 and the P-type pillar 04. A heavily doped N-type source region 10 and a heavily doped P-type source region 11 are arranged in the P-type body region 08. The N-type source region 10 is electrically connected to a substrate metal 12. The P-type source region 11 is electrically connected to a source metal 14. A gate trench 06 is formed in the N-type pillar 03. An insulating dielectric layer 9 covers onto the gate trench.

Discrete gate polycrystalline silicon is provided in the gate trench 06. First gate polycrystalline silicon 07 is located on a surface of the trench, and second gate polycrystalline silicon 05 is located at a bottom of the trench. The first gate polycrystalline silicon 07 and the second gate polycrystalline silicon 05 are isolated by an oxide layer 13. The first gate polycrystalline silicon 07 is insulated from the second gate polycrystalline silicon 05.

Preferably, the gate trench 06 has an opening width of 0.3-2 μm. The gate trench 06 has a depth of 0.5-5 μm. The second gate polycrystalline silicon 05 has a length of 0.3-4 μm.

The semiconductor device is a super junction MOSFET.

Figure 4:
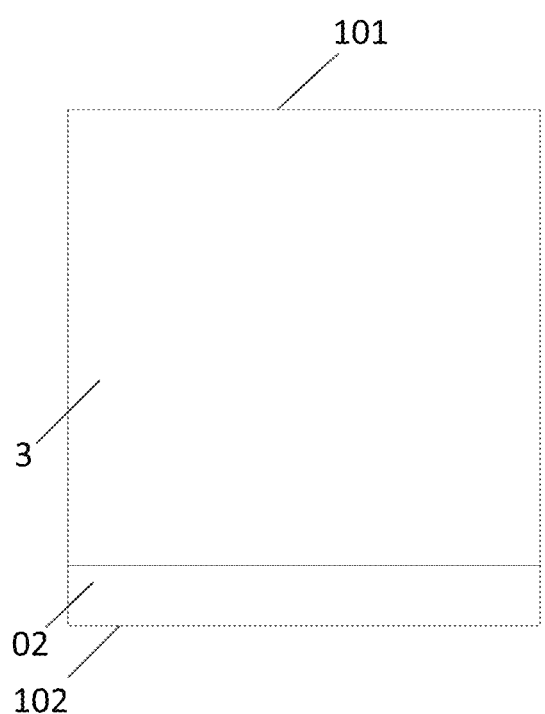
FIG. 4 is a cross-sectional structural view showing formation of an epitaxial layer.

A third embodiment of the present disclosure provides a manufacturing method of a semiconductor device for reducing a switching loss, which takes an N-type super junction trench power semiconductor device as an example, and includes the following steps:

Step 1: Select a material of an N-type silicon substrate 02, and epitaxially grow an N-type epitaxial layer 3, as shown in FIG. 4.

Figure 5:
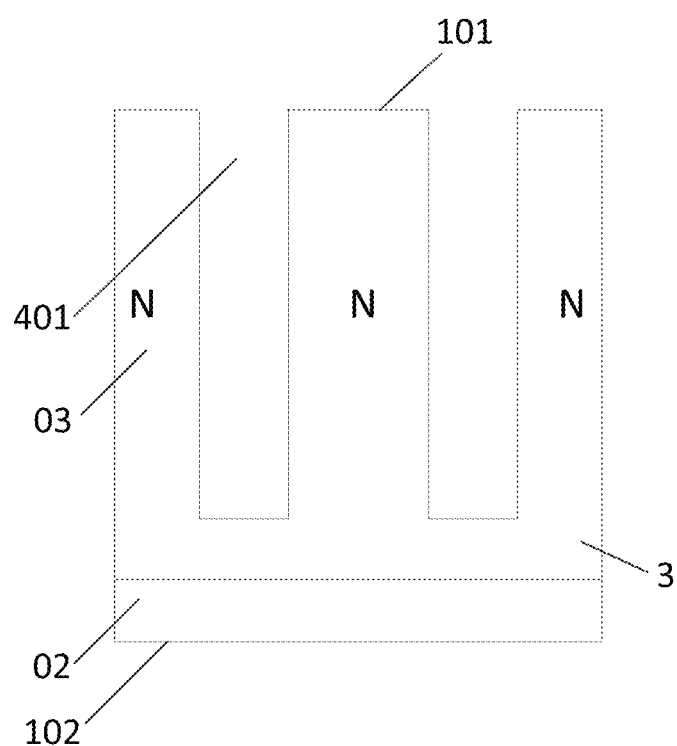
FIG. 5 is a cross-sectional structural view showing formation of a deep trench.

Step 2: Perform selective etching on the N-type epitaxial layer 3 to form a deep trench 401, as shown in FIG. 5.

Figure 6:
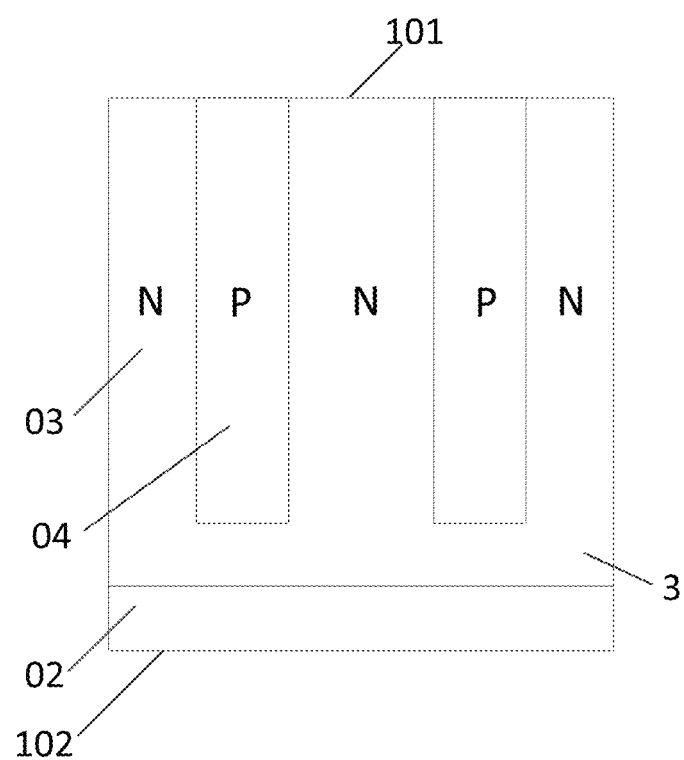
FIG. 6 is a cross-sectional structural view showing formation of a pillar of a second conductive type.

Step 3: Deposit P-type silicon to fill the deep trench 401 fully, form an N-type pillar 03 and a P-type pillar 04 that are spaced apart from each other in the N-type epitaxial layer 3, and remove a structure above an upper surface 101, as shown in FIG. 6.

Figure 7:
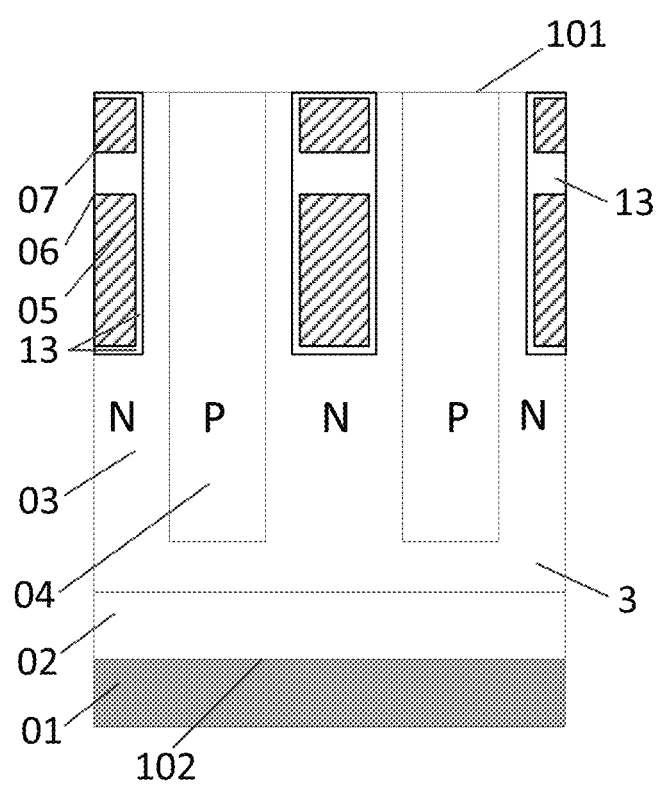
FIG. 7 is a cross-sectional structural view showing formation of first gate polycrystalline silicon and second gate polycrystalline silicon.

Step 4: Perform selective etching on the N-type epitaxial layer 3 to form a gate trench 06, grow an oxide layer in the gate trench 06, deposit polycrystalline silicon and etch the polycrystalline silicon to a certain depth to form second gate polycrystalline silicon 05, grow an oxide layer 13 between first gate polycrystalline silicon 07 and the second gate polycrystalline silicon 05, deposit the polycrystalline silicon again to form the first gate polycrystalline silicon 07, and remove a structure above the upper surface 101, as shown in FIG. 7.

Figure 8:
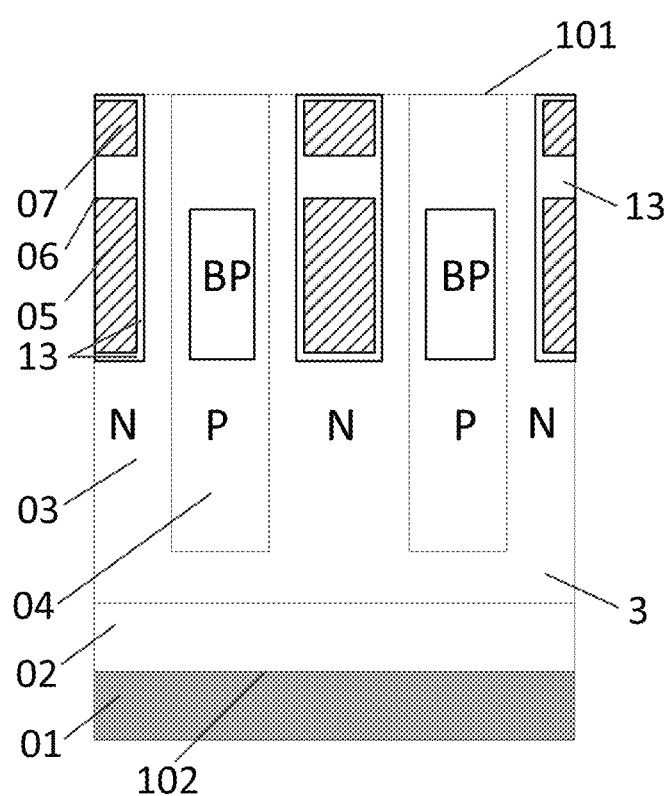
FIG. 8 is a cross-sectional structural view showing formation of a buried layer of a second conductive type.

Step 5: Inject high-concentration P-type impurities into the P-type pillar 04 by high-energy ion implantation using a mask window, and activate the impurities to form a P-type buried layer 15, as shown in FIG. 8.

Figure 9:
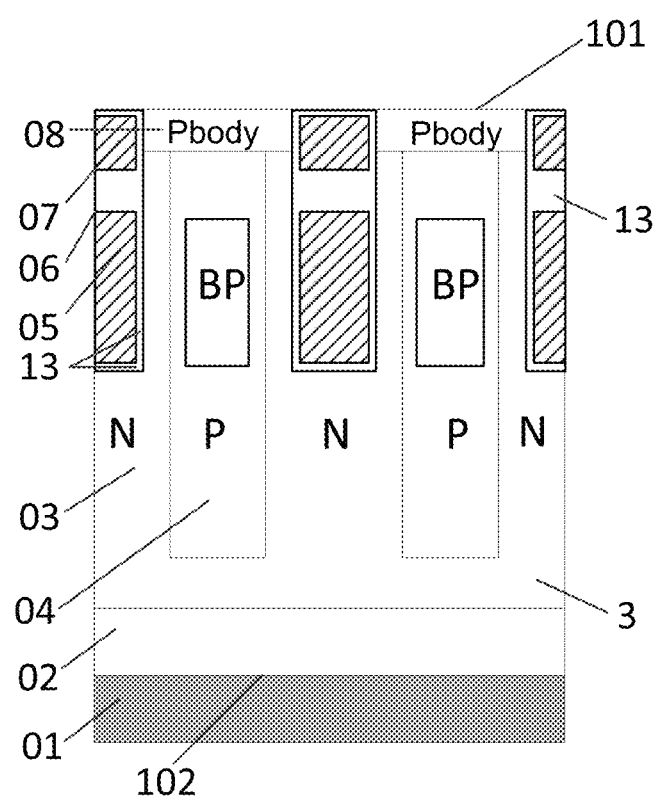
FIG. 9 is a cross-sectional structural view showing formation of a body region of a second conductive type.

Step 6: Inject P-type impurities into the upper surface 101, and perform thermal annealing to form a P-type body region 08, as shown in FIG. 9.

Figure 10:
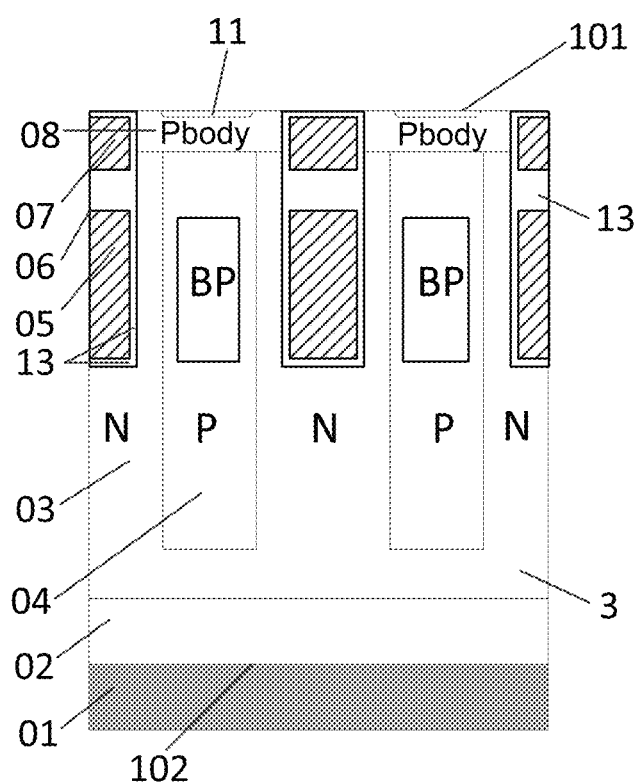
FIG. 10 is a cross-sectional structural view showing formation of a source region of a second conductive type.

Step 7: Inject the P-type impurities into the P-type body region using the mask window, and activate the impurities to form a P-type source region 11, as shown in FIG. 10.

Figure 11:
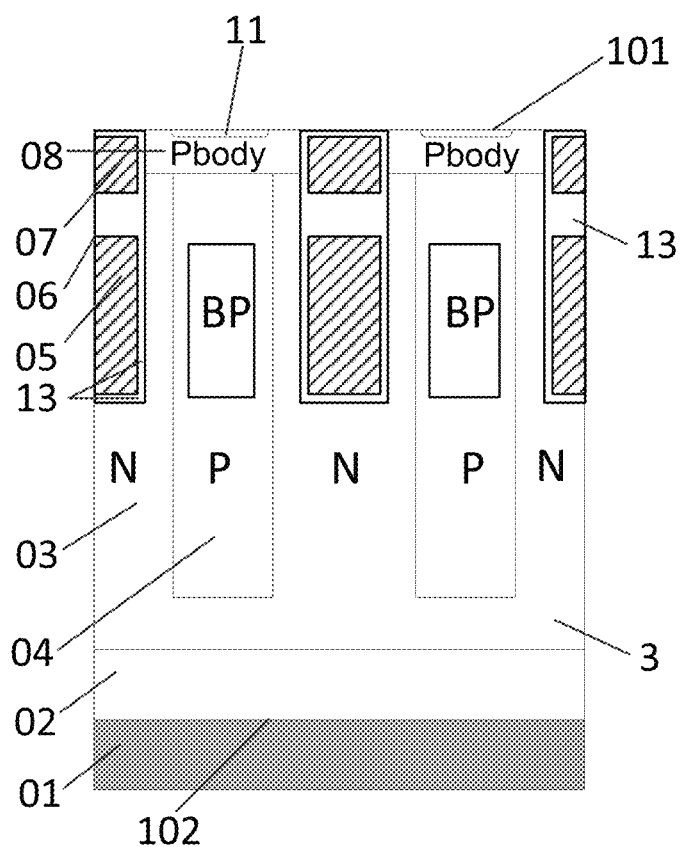
FIG. 11 is a cross-sectional structural view showing formation of a source region of a first conductive type.

Step 8: Inject N-type impurities into two sides of the gate trench using the mask window, and activate the impurities to form an N-type source region 10, as shown in FIG. 11.

Step 9: Deposit an insulating dielectric layer 09 on a front surface, perform selective etching on the insulating dielectric layer 09 to form through holes, and deposit metal and selectively etch the metal to form a source metal 14, a substrate metal 12, a source metal 01, a first gate metal and a second gate metal, as shown in FIG. 1. The first gate metal and the second gate metal are not shown in the figure and are respectively connected to the first gate polycrystalline silicon 07 and the second gate polycrystalline silicon 05.

A fourth embodiment of the present disclosure provides a manufacturing method of a semiconductor device for reducing a switching loss, which takes an N-type super junction trench power semiconductor device as an example, and includes the following steps:

Step 1: Select a material of an N-type silicon substrate 02, and epitaxially grow an N-type epitaxial layer 3, as shown in FIG. 4.

Figure 12:
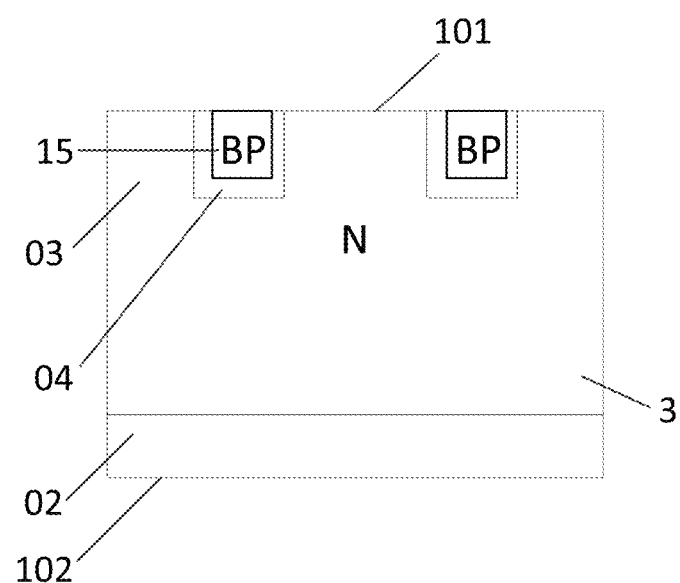
FIG. 12 is a cross-sectional structural view for injecting impurities of a second type having a low diffusion coefficient and impurities of the second type having a high diffusion coefficient according to a fourth embodiment.

Step 2: Inject P-type impurities having a low diffusion coefficient and P-type impurities having a high diffusion coefficient into a surface of the N-type epitaxial layer 3 using a mask window to form a P-type pillar 04 and a P-type buried layer 15, as shown in FIG. 12.

Figure 13:
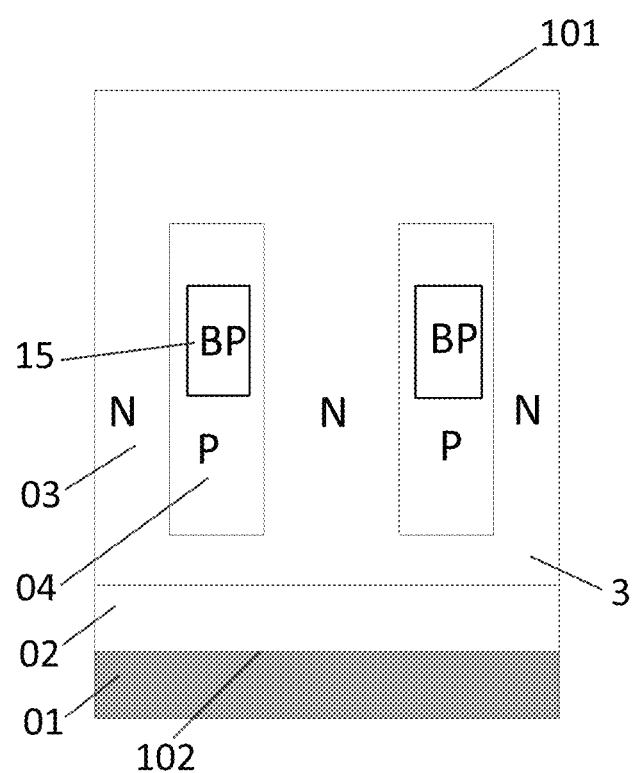
FIG. 13 is a cross-sectional structural view for secondarily growing an epitaxial layer according to a fourth embodiment.

Step 3: Perform second epitaxial growth on an upper surface 101 to continuously grow the N-type epitaxial layer 3, where the P-type pillar 04 is diffused more than the P-type buried layer 15 during growth of the epitaxial layer, as shown in FIG. 13.

Figure 14:
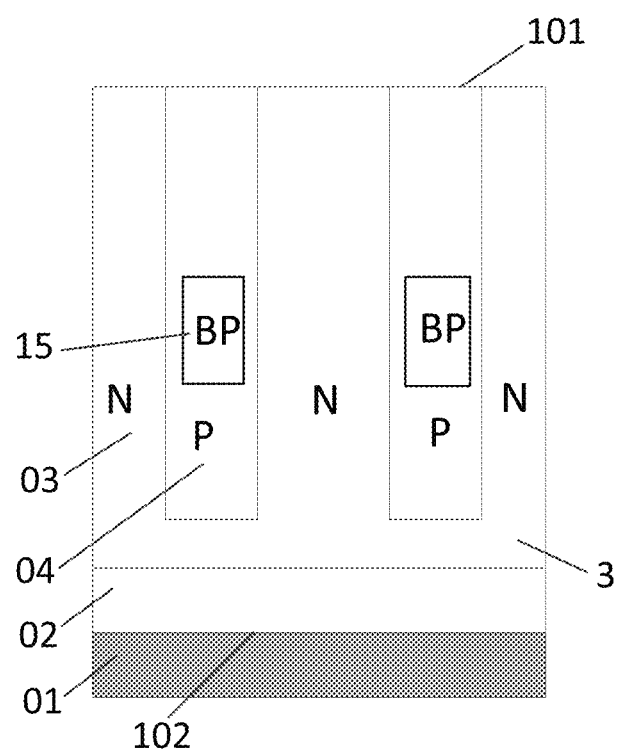
FIG. 14 is a cross-sectional structural view showing formation of a final pillar of a second conductive type according to a fourth embodiment.

Step 4: Inject the P-type impurities having the high diffusion coefficient into the upper surface 101 using the mask window in Step 2, and activate the impurities by thermal annealing, such that the impurities are further diffused to connect the P-type pillar in Step 3, thereby forming the final P-type pillar 04, as shown in FIG. 14.

Figure 15:
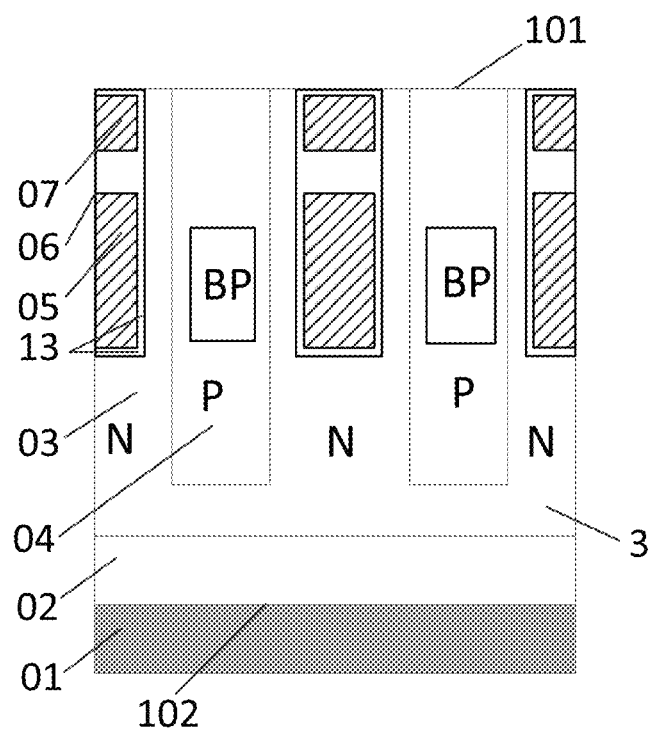
FIG. 15 is a cross-sectional structural view showing formation of first gate polycrystalline silicon and second gate polycrystalline silicon according to a fourth embodiment.
Figure 16:
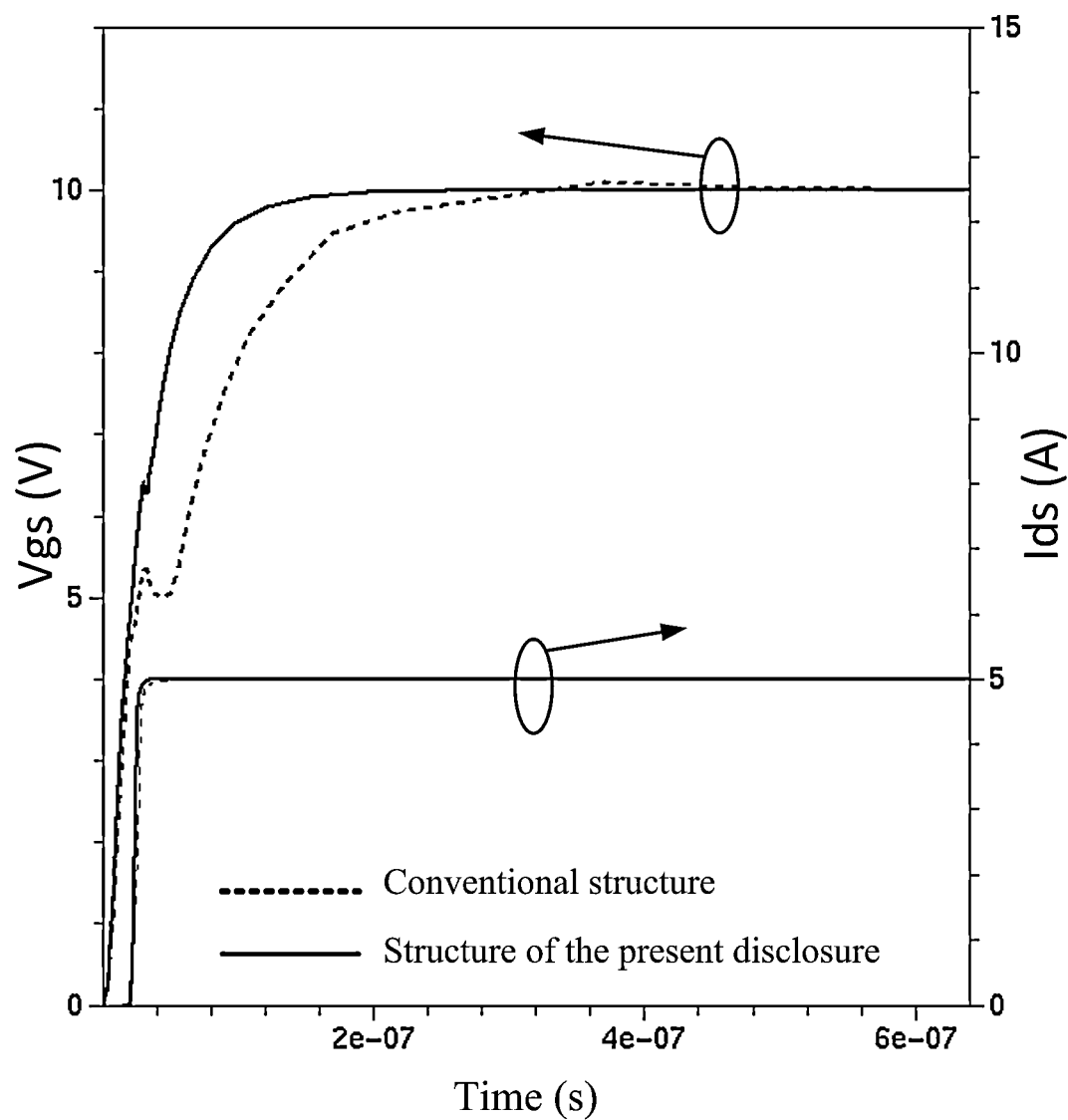
FIG. 16 illustrates a comparison between a structure of the present disclosure and a conventional structure in a turn-on waveform in a resistance switching test.
Figure 17:
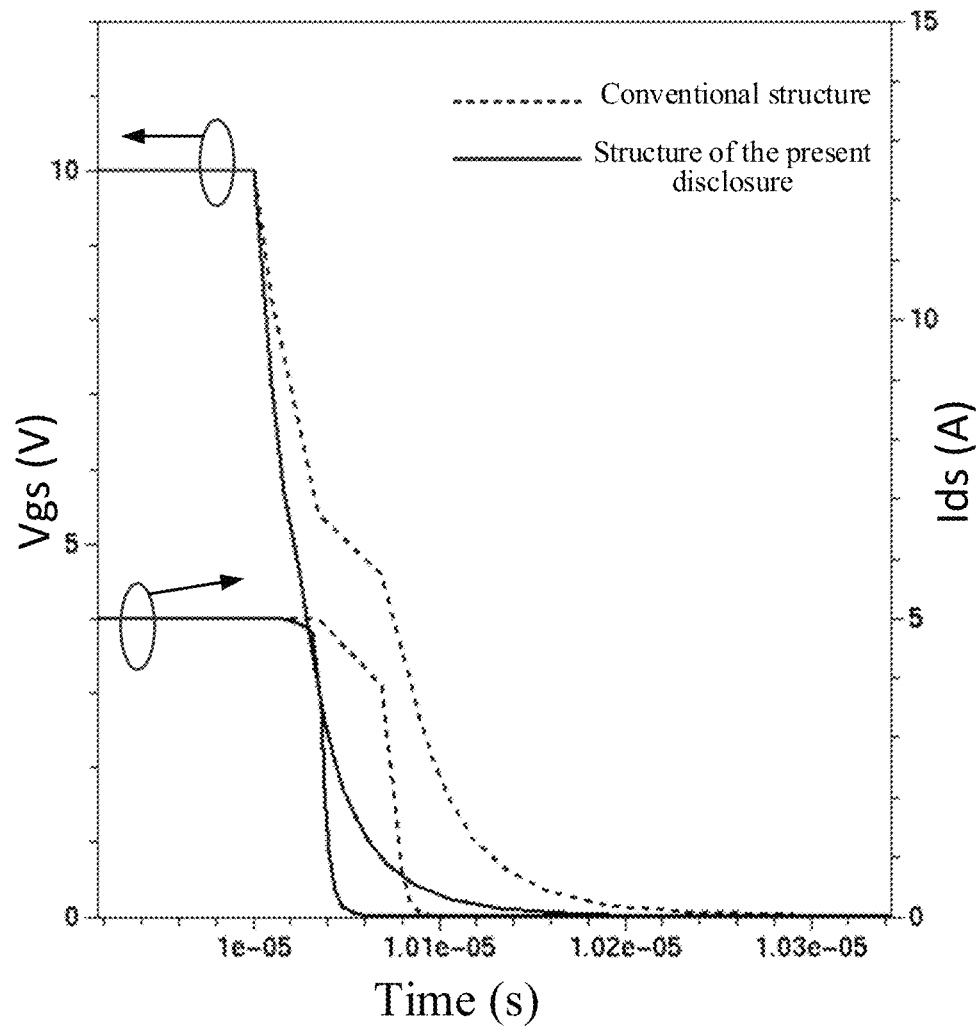
FIG. 17 illustrates a comparison between a structure of the present disclosure and a conventional structure in a turn-off waveform in a resistance switching test.

Step 5: Perform selective etching on the N-type epitaxial layer 3 to form a gate trench 06, grow an oxide layer in the gate trench 06, deposit polycrystalline silicon and etch the polycrystalline silicon to a certain depth to form second gate polycrystalline silicon 05, grow an oxide layer 13 between first gate polycrystalline silicon 07 and the second gate polycrystalline silicon 05, deposit the polycrystalline silicon again to form the first gate polycrystalline silicon 07, and remove a structure above the upper surface 101, as shown in FIG. 15.

Step 6: Inject P-type impurities into the upper surface 101, and perform the thermal annealing to form a P-type body region 08, as shown in FIG. 10.

Step 7: Inject the P-type impurities into the P-type body region 08 using the mask window, and activate the impurities to form a P-type source region 11, as shown in FIG. 11.

Step 8: Inject N-type impurities into two sides of the gate trench 06 using the mask window, and activate the impurities to form an N-type source region 10, as shown in FIG. 12.

Step 9: Deposit an insulating dielectric layer 09 on a front surface, perform selective etching on the insulating dielectric layer 09 to form through holes, and deposit metal and selectively etch the metal to form a source metal 14, a substrate metal 12, a source metal 01, a first gate metal and a second gate metal, as shown in FIG. 1. The first gate metal and the second gate metal are not shown in the figure and are respectively connected to the first gate polycrystalline silicon 07 and the second gate polycrystalline silicon 05.

The working principle of the present disclosure is as follows:

When the device operates, the substrate metal 12, the source metal 14 and the second gate polycrystalline silicon 05 are all grounded or connected to a negative voltage. When the device is turned on, a voltage on the first gate polycrystalline silicon 07 gradually raises. In view of a small overlapping area between the first gate polycrystalline silicon and the N-type pillar, there is a small Cgs. For the device with the gate platform voltage, the gate current is used to charge the Cgs. In case of the small Cgs, the charging time is shorter and the device is turned on more quickly, thereby reducing the turn-on loss of the device. When the device is turned off, the voltage on the first gate polycrystalline silicon 07 gradually decreases. In view of the assisted depletion of the second gate polycrystalline silicon 05 on the N-type pillar (namely the drift region) and the reduced Cgs, the device in the present disclosure can be turned off more quickly than the conventional device. In order to enhance the assisted depletion effect of the second gate polycrystalline silicon 05 on the N-type pillar, both the second gate polycrystalline silicon 05 and the substrate metal can be connected to the negative voltage. In conclusion, the device in present disclosure can be turned off or on more quickly, thereby reducing the switching loss.

It should be noted that the above embodiments are only intended to explain, rather than to limit the technical solutions of the present disclosure. Although the present disclosure is described in detail with reference to the examples, those of ordinary skill in the art should understand that modifications or equivalent substitutions may be made to the technical solutions of the present disclosure without departing from the spirit and scope of the technical solutions of the present disclosure, and such modifications or equivalent substitutions should be included within the scope of the claims of the present disclosure.

What is claimed is:

1. A semiconductor device for reducing a switching loss, comprising a drain metal, wherein a silicon substrate of a first conductive type is provided on the drain metal; a contact surface between the drain metal of the first conductive type defines a lower surface; an epitaxial layer of the first conductive type is provided on the silicon substrate of the first conductive type; a pillar of the first conductive type and a pillar of a second conductive type are arranged in the epitaxial layer of the first conductive type, wherein the pillar of the first conductive type and the pillar of the second conductive type are spaced apart from each other; a body region of the second conductive type is provided on a surface of each of the pillar of the first conductive type and the pillar of the second conductive type; a heavily doped source region of the first conductive type and a heavily doped source region of the second conductive type are arranged in the body region of the second conductive type; the heavily doped source region of the first conductive type is electrically connected to a substrate metal; the heavily doped source region of the second conductive type is electrically connected to a source metal; a gate trench is formed in the pillar of the first conductive type; and an insulating dielectric layer covers onto the gate trench; and first gate polycrystalline silicon and second gate polycrystalline silicon are discrete in the gate trench, wherein the first gate polycrystalline silicon is located on a surface of the gate trench, and the second gate polycrystalline silicon is located at a bottom of the gate trench; the first gate polycrystalline silicon and the second gate polycrystalline silicon are isolated by an oxide layer; and the first gate polycrystalline silicon is insulated from the second gate polycrystalline.

2. The semiconductor device for reducing the switching loss according to claim 1, wherein
a high-concentration buried layer of the second conductive type is provided in the pillar of the second conductive type.

3. The semiconductor device for reducing the switching loss according to claim 1, wherein
for an N-type power semiconductor device, the first conductive type is an N type, and the second conductive type is a P type; and for a P-type power semiconductor device, the first conductive type is a P type, and the second conductive type is an N type.

4. The semiconductor device for reducing the switching loss according to claim 1, wherein
the gate trench has an opening width of 0.3-2 µm.

5. The semiconductor device for reducing the switching loss according to claim 1, wherein
the gate trench has a depth of 0.5-5 µm.

6. The semiconductor device for reducing the switching loss according to claim 1, wherein
the second gate polycrystalline silicon has a length of 0.3 µm.

7. A manufacturing method of a semiconductor device for reducing a switching loss, comprising the following steps:

step 1: selecting a material of a silicon substrate of a first conductive type, and epitaxially growing an epitaxial layer of the first conductive type on the silicon substrate of the first conductive type;

step 2: performing selective etching on the epitaxial layer of the first conductive type to form a deep trench;

step 3: depositing silicon of a second conductive type to fill the deep trench fully, forming a pillar of the first conductive type and a pillar of the second conductive type in the epitaxial layer of the first conductive type, and removing a structure above an upper surface, wherein the pillar of the first conductive type and the pillar of the second conductive type are spaced apart from each other;

step 4: performing selective etching on the epitaxial layer of the first conductive type to form a gate trench, growing an oxide layer in the gate trench, depositing polycrystalline silicon and etching the polycrystalline silicon to a certain depth to form second gate polycrystalline silicon, growing the oxide layer between first gate polycrystalline silicon and the second gate polycrystalline silicon, depositing the polycrystalline silicon again to form the first gate polycrystalline silicon, and removing a structure above the upper surface;

step 5: injecting high-concentration impurities of the second conductive type into the pillar of the second conductive type by high-energy ion implantation using a mask window, and activating the high-concentration impurities of the second conductive type to form a buried layer of the second conductive type;

step 6: injecting impurities of the second conductive type into the upper surface, and performing thermal annealing on the impurities of the second conductive type to form a body region of the second conductive type;

step 7: injecting the impurities of the second conductive type into the body region of the second conductive type using the mask window, and activating the impurities of the second conductive type to form a source region of the second conductive type;

step 8: injecting impurities of the first conductive type into two sides of the gate trench using the mask window, and activating the impurities of the first conductive type to form a source region of the first conductive type; and step 9: depositing an insulating dielectric layer on a front surface, performing selective etching on the insulating dielectric layer to form through holes, depositing metal and selectively etching the metal to form a source metal, a substrate metal, a drain metal, a first gate metal and a second gate metal.

8. A manufacturing method of a semiconductor device for reducing a switching loss, comprising the following steps:
- step 1: selecting a material of a silicon substrate of a first conductive type, and epitaxially growing an epitaxial layer of the first conductive type on the silicon substrate of the first conductive type;
- step 2: injecting impurities of a second conductive type having a low diffusion coefficient and impurities of the second conductive type having a high diffusion coefficient into a surface of the epitaxial layer of the first conductive type using a mask window to form a pillar of the second conductive type and a buried layer of the second conductive type, respectively;
- step 3: performing second epitaxial growth on an upper surface to continuously grow the epitaxial layer of the first conductive type, wherein the pillar of the second conductive type is diffused more than the buried layer of the second conductive type during growth of the epitaxial layer;
- step 4: injecting the impurities of the second conductive type having the high diffusion coefficient into the upper surface using the mask window in step 2, and activating the impurities of the second conductive type having the high diffusion coefficient by thermal annealing, such that the impurities of the second conductive type having the high diffusion coefficient are further diffused to connect the pillar of the second conductive type in step 3 to form a final pillar of the second conductive type;
- step 5: performing selective etching on the epitaxial layer of the first conductive type to form a gate trench, growing an oxide layer in the gate trench, depositing polycrystalline silicon and etching the polycrystalline silicon to a certain depth to form second gate polycrystalline silicon, growing the oxide layer between first gate polycrystalline silicon and the second gate polycrystalline silicon, depositing the polycrystalline silicon again to form the first gate polycrystalline silicon, and removing a structure above the upper surface;
- step 6: injecting impurities of the second conductive type into the upper surface, and performing the thermal annealing on the impurities of the second conductive type to form a body region of the second conductive type;
- step 7: injecting the impurities of the second conductive type into the body region of the second conductive type using the mask window, and activating the impurities of the second conductive type to form a source region of the second conductive type;
- step 8: injecting impurities of the first conductive type into two sides of the gate trench using the mask window, and activating the impurities of the first conductive type to form a source region of the first conductive type; and
- step 9: depositing an insulating dielectric layer on a front surface, performing selective etching on the insulating dielectric layer to form through holes, depositing metal and selectively etching the metal to form a source metal, a substrate metal, a drain metal, a first gate metal and a second gate metal.

* * * * *